(12) United States Patent
Deline et al.

(10) Patent No.: US 9,564,356 B2
(45) Date of Patent: Feb. 7, 2017

(54) SELF-FORMING METAL BARRIERS

(71) Applicant: International Business Machines Corporation, Armonk, NY (US)

(72) Inventors: Vaughn R. Deline, Palo Alto, CA (US); Geraud J. Dubois, Los Altos, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 14/688,549

(22) Filed: Apr. 16, 2015

(65) Prior Publication Data

US 2016/0307794 A1 Oct. 20, 2016

(51) Int. Cl.

| | |
|---|---|
| *B05D 5/12* | (2006.01) |
| *H01L 21/00* | (2006.01) |
| *H01L 21/768* | (2006.01) |
| *H05K 3/40* | (2006.01) |
| *H05K 3/10* | (2006.01) |
| *H05K 3/42* | (2006.01) |
| *H05K 3/46* | (2006.01) |
| *H05K 3/12* | (2006.01) |
| *H01L 23/522* | (2006.01) |

(52) U.S. Cl.
CPC ... *H01L 21/76828* (2013.01); *H01L 21/76805* (2013.01); *H01L 21/76831* (2013.01); *H01L 21/76877* (2013.01); *H05K 3/4038* (2013.01); *H01L 23/5226* (2013.01); *H05K 3/10* (2013.01); *H05K 3/12* (2013.01); *H05K 3/42* (2013.01); *H05K 3/46* (2013.01)

(58) Field of Classification Search
USPC .............................................. 427/97.1–98.4
See application file for complete search history.

(56) References Cited

U.S. PATENT DOCUMENTS

| | | | |
|---|---|---|---|
| 6,607,892 B2 * | 8/2003 | Kapeller-Libermann | C12N 9/88 435/232 |
| 7,141,496 B2 | 11/2006 | DeYoung et al. | |
| 7,718,524 B2 | 5/2010 | Ooka | |
| 8,357,599 B2 | 1/2013 | Schieffer et al. | |

(Continued)

FOREIGN PATENT DOCUMENTS

| | | | |
|---|---|---|---|
| EP | 1990432 | * | 11/2008 |
| KR | 2001-0085384 | * | 9/2001 |
| WO | WO 2009/096264 | * | 8/2009 |

OTHER PUBLICATIONS

Koike et al., "Cu Alloy Metallization for Self-Forming Barrier Process," Proc. IEEE Int. Interconnect Technology Conference, pp. 161-163, 2006.

(Continued)

*Primary Examiner* — Brian K Talbot
(74) *Attorney, Agent, or Firm* — Shumaker & Sieffert, P.A.

(57) ABSTRACT

A technique includes applying a liquid dielectric composition onto a substrate, where the composition includes metal ions, at least partially curing the composition to form a dielectric layer with the metal ions, patterning the dielectric layer to form electron-rich regions at a surface thereof, heating the patterned dielectric layer to drive the metal ions to the electron-rich regions thereof, thereby forming a metal barrier layer on at least a portion of the surface of the dielectric layer, and depositing one or more metal layers onto the metal barrier layer.

19 Claims, 11 Drawing Sheets

(56) References Cited

U.S. PATENT DOCUMENTS

| | | | |
|---|---|---|---|
| 8,372,745 B2 | 2/2013 | Koike | |
| 8,461,683 B2 | 6/2013 | Yoo et al. | |
| 8,766,342 B2 | 7/2014 | Akolkar | |
| 2012/0161320 A1 | 6/2012 | Akolkar et al. | |
| 2015/0108646 A1* | 4/2015 | Chae | H01L 23/5226 257/751 |
| 2015/0214157 A1* | 7/2015 | Canaperi | H01L 23/53238 257/751 |
| 2015/0345045 A1* | 12/2015 | Shaviv | H01L 23/528 257/751 |
| 2016/0211216 A1* | 7/2016 | Xu | H01L 23/53219 |

OTHER PUBLICATIONS

Koike et al., "Self-Formed Barrier with Cu-MN alloy Metallization and its Effects on Reliability," Proc. AIP Conference 817, pp. 43-51, Feb. 7, 2006.

Sixt et al., "Control of Positive Surface Charge in Si-SiO2 Interfaces by Use of Implanted Cs Ions," Applied Physics Letters, vol. 19, No. 11, Dec. 1, 1971, 2 pp.

L. Krusin-Elbaum, "Dependence of the Flatband Voltage of Si-MOS on Distribution of Cesium in SiO2—Comparison of Two Implantation Methods," The Electrochemical Society, vol. 133 No. 8, Aug. 1, 1986 4 pp.

Chung et al., "Analysis of dielectric constant of a self-forming barrier layer with Cu-Mn alloy on TEOS-SiO2," Journal of Vacuum Science & Technology B 27(5), Sep. 21, 2009, 4 pp.

Koike et al., "Self-forming diffusion barrier layer in Cu-MN alloy metallization," Applied Physics Letters 87, Jul. 22, 2005, 3 pp.

Usui et al., "Highly Reliable Copper Dual-Damascene Interconnects With Self-Formed MnSixOy Barrier Layer," IEEE Transactions on Electron Devices, vol. 53 No. 10, Oct. 2006, pp. 2492-2499.

* cited by examiner

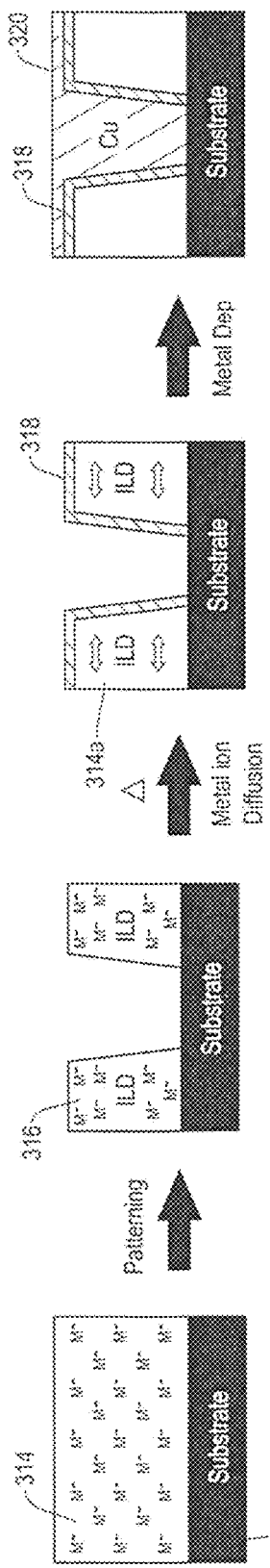

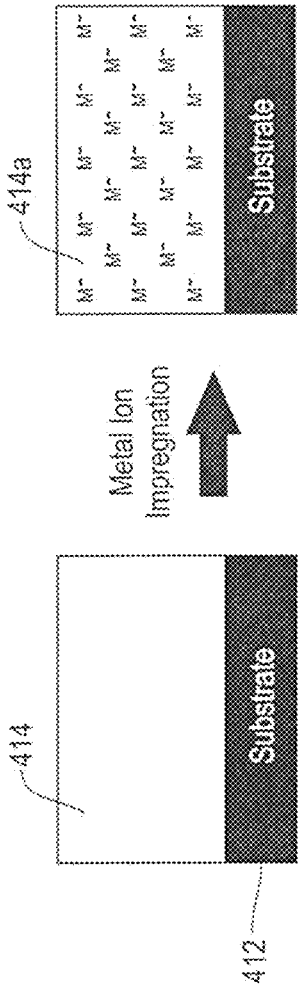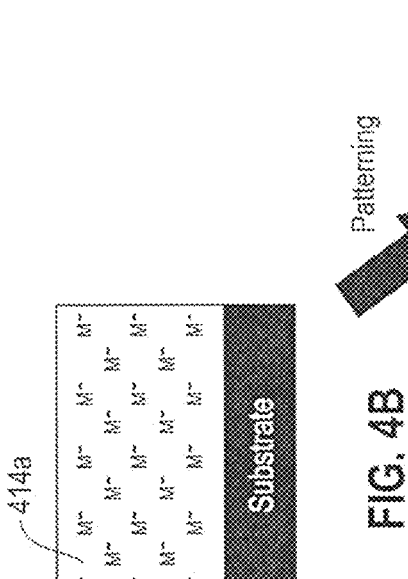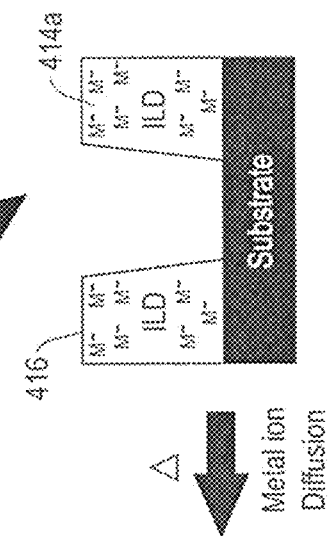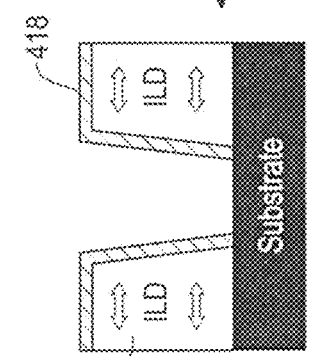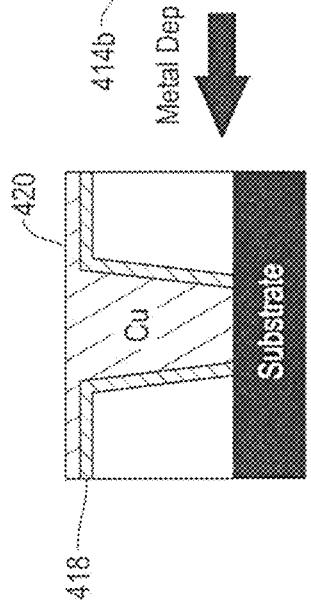

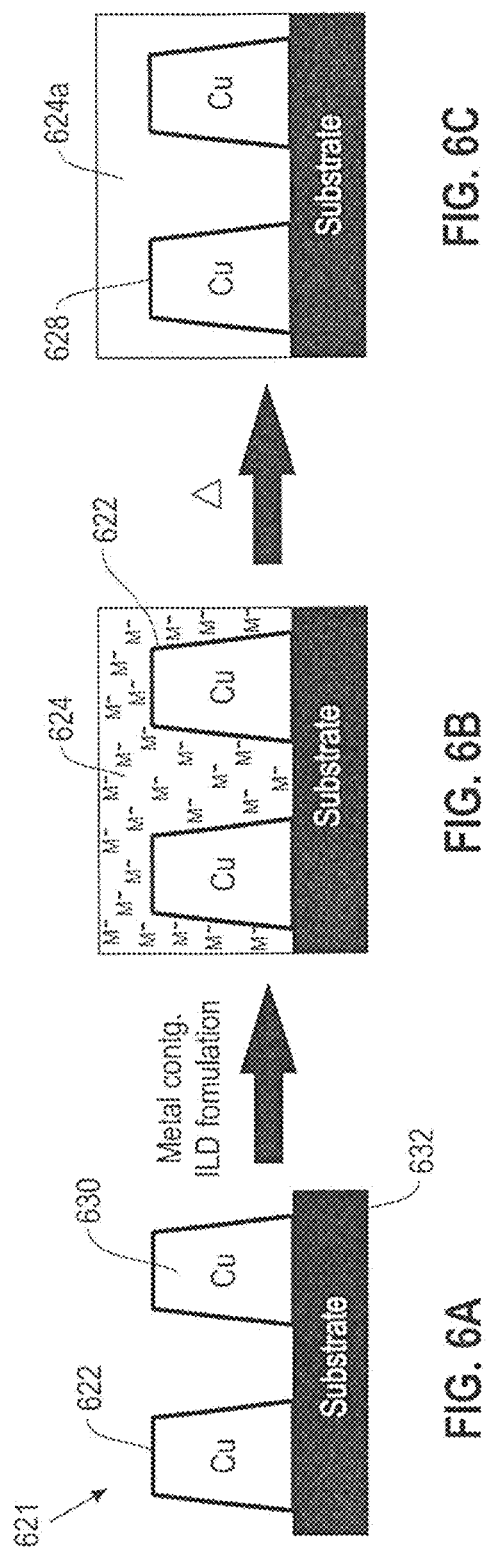

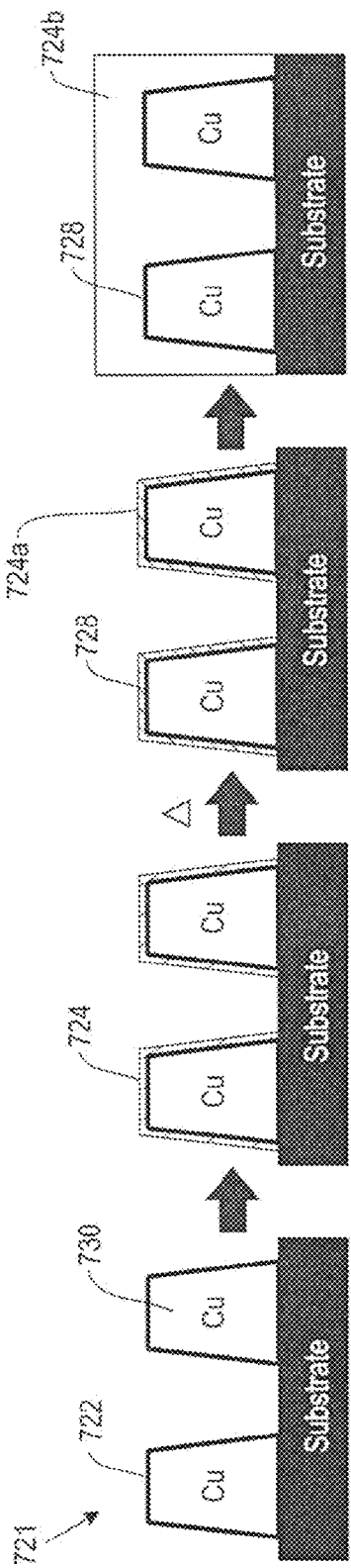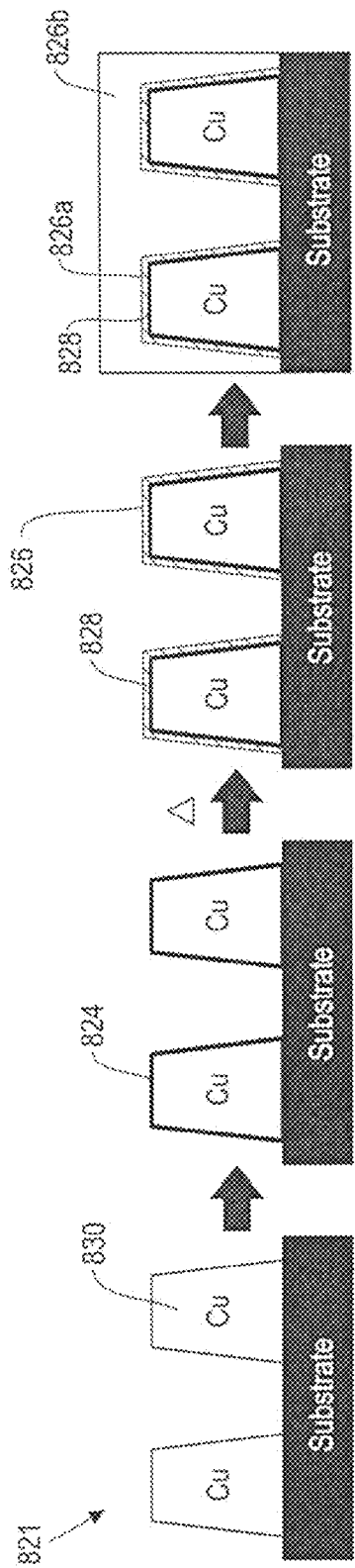

SELF-FORMING METAL BARRIERS

BACKGROUND

The semiconductor industry continues to present a need for the development of new dielectric materials with a low dielectric constant (k). In integrated chips or other microelectronic structures, dielectric material is typically in contact with metal interconnects, which provide conductive channels. Diffusion of metals such as copper (Cu) from interconnects into adjacent dielectric material can lead to the degradation of the electrical properties of the dielectric.

A metal barrier can be applied on a dielectric material to prevent diffusion, as shown in FIG. 1. Layers of tantalum nitride 9 and tantalum 7 are deposited over patterned dielectric 3 disposed on substrate 1. The layers 9 and 7 form a metal barrier against diffusion of Cu from the subsequently applied interconnect 2 into the patterned dielectric 3.

A self-forming metal barrier shown in FIG. 2 can also be used to prevent Cu diffusion from an interconnect into an adjacent dielectric material. A seed layer 4 of Cu—Mn (copper-manganese) alloy is deposited over patterned dielectric 3 disposed on a substrate 1, followed by deposition of a Cu interconnect 2. On heating the structure, a non-Cu metal component Mn in the Cu—Mn alloy segregates to the interface between the dielectric 3 and the interconnect 2. The Mn then reacts with the dielectric to form a barrier layer 5.

SUMMARY

The self-forming metal barrier processes described in FIGS. 1-2 above rely on the deposition of a metal layer or diffusion of a barrier metal from an interconnect metal alloy to an interface between the interconnect metal alloy and a dielectric material. As the Cu lines/interconnects decrease in size, the corresponding barrier layer thickness also needs to decrease to maintain the overall metal resistivity, and formation of continuous and uniform barrier coatings is expected to become increasingly more difficult. The present disclosure describes a process in which metal ions incorporated in a dielectric material diffuse from within the dielectric material itself to an electron-rich region thereof to form a metal barrier.

In general, according to the methods described in the present disclosure, as a dielectric material is processed to form, for example, a semiconductor device, the metals in the dielectric material migrate to an electron-rich region of the dielectric material to form a barrier layer. The barrier layer can limit or substantially prevent the undesirable diffusion of metal ions from a subsequently applied metal interconnect into the dielectric material.

In one aspect, the present disclosure is directed to a method including applying a liquid dielectric composition onto a substrate, wherein the composition includes metal ions; at least partially curing the composition to form a dielectric layer with the metal ions; patterning the dielectric layer to form electron-rich regions at a surface thereof; heating the patterned dielectric layer to drive the metal ions to the electron-rich regions thereof, thereby forming a metal barrier layer on at least a portion of the surface of the dielectric layer; and depositing one or more metal layers onto the metal barrier layer.

In another aspect, the present disclosure is directed to a method including impregnating at least a surface region of a cured dielectric layer with a metal ion; patterning the dielectric layer, thereby forming electron-rich regions at a surface of the patterned dielectric layer; heating the patterned dielectric layer to drive the metal ions to the electron-rich regions and form a metal barrier layer at the surface of the patterned dielectric layer; and depositing one or more metal layers onto the patterned dielectric layer.

In another aspect, the present disclosure is directed to a method including forming a metal pattern on a substrate, wherein a surface of the metal pattern includes electron-rich regions; depositing a first dielectric layer onto the metal pattern, wherein the first dielectric layer includes a metal ion; and heating the first dielectric layer to cause the metal ions to diffuse to the electron-rich regions of the metal pattern, thereby forming a metal barrier layer on the metal pattern.

In various embodiments, the barrier layers possess low resistivity to avoid reducing the overall conductivity of a structure such as, for example, a semiconductor device. In various embodiments, barrier layers made according to the methods of this disclosure can be formed at less than about 5 nm thicknesses, exhibit good thermal stability, have excellent adhesion to conductive metals (such as Cu), and have low Cu interface diffusivity.

The details of one or more aspects of the invention are set forth in the accompanying drawings and the description below. Other features, objects, and advantages of the invention will be apparent from the description and drawings, and from the claims.

BRIEF DESCRIPTION OF DRAWINGS

The foregoing and other aspects of this invention are made more evident in the following Detailed Description, when read in conjunction with the attached Drawing Figures, wherein:

FIGS. 3A-3D are schematic cross-sectional views of a semiconductor device structure and a method for the manufacture thereof.

FIGS. 4A-4E are schematic cross-sectional views of a semiconductor device structure and a method for the manufacture thereof.

FIGS. 6A-6C are schematic cross-sectional views of a semiconductor device structure and a method for the manufacture thereof.

FIGS. 7A-7D are schematic cross-sectional views of a semiconductor device structure and a method for the manufacture thereof.

FIGS. 8A-8D are schematic cross-sectional views of a semiconductor device structure and a method for the manufacture thereof.

Figure 1:
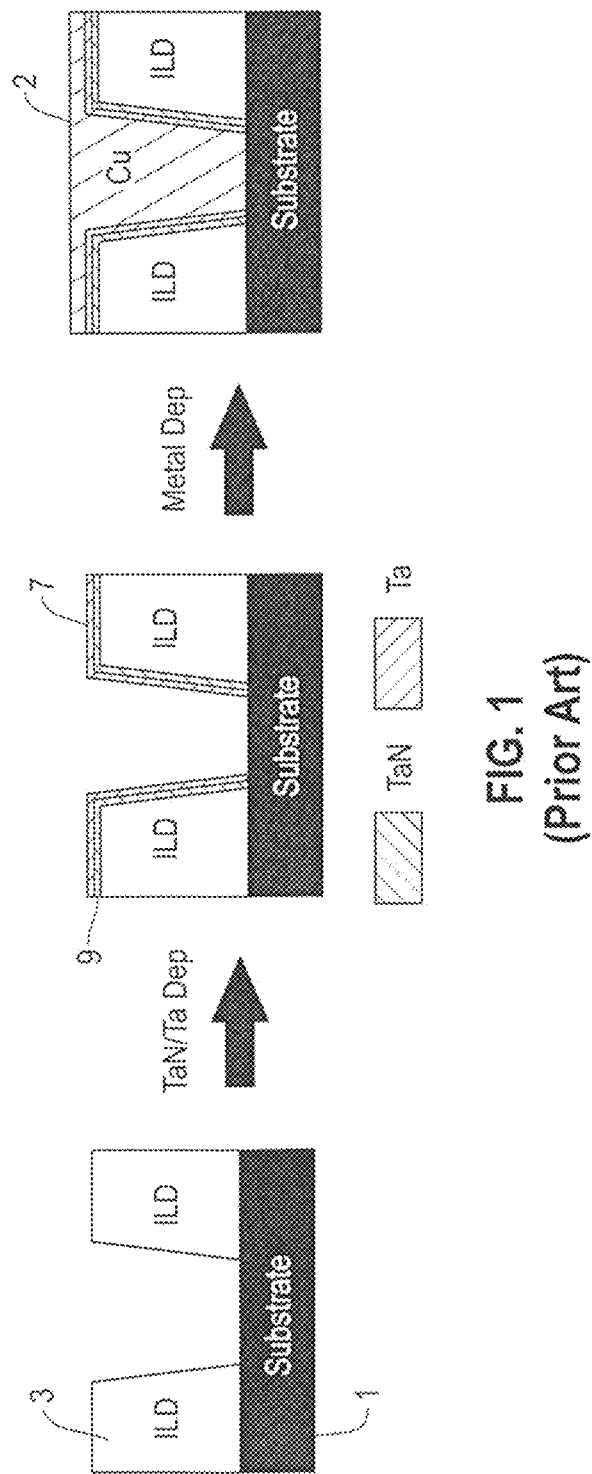
FIG. 1 is a schematic, cross-sectional view of a method for forming a metal barrier.
Figure 2:
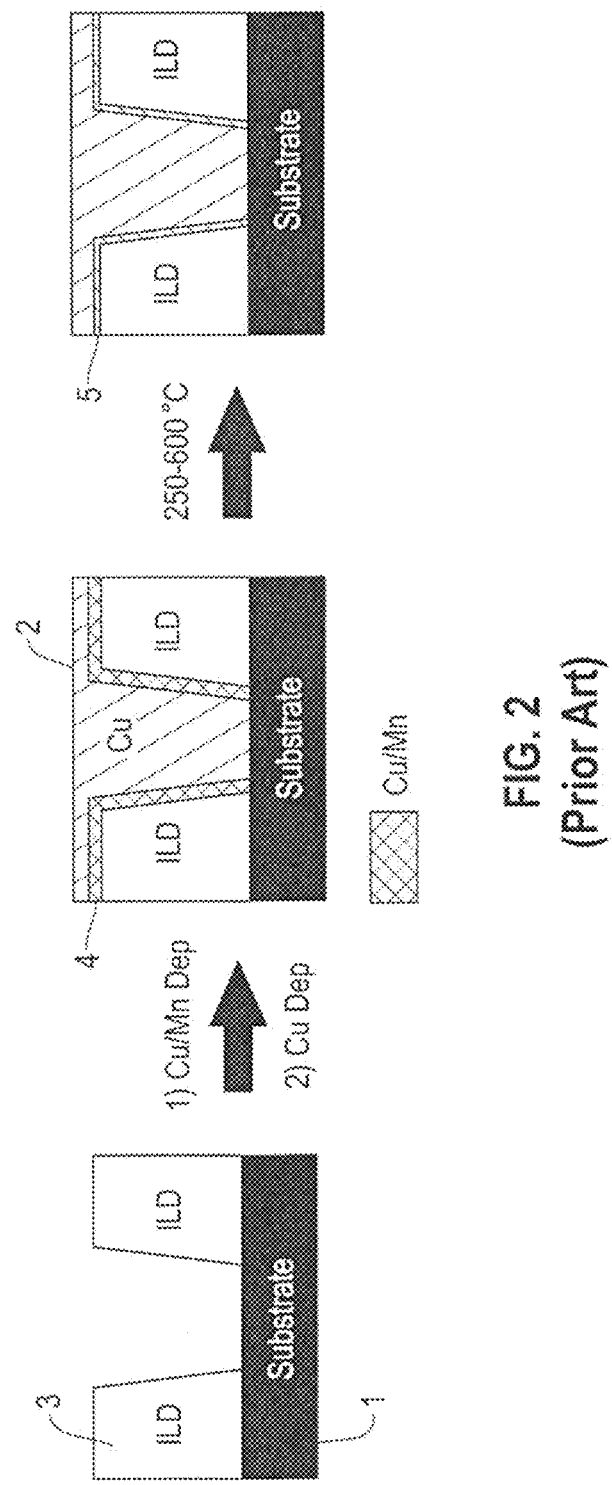
FIG. 2 is a schematic, cross-sectional view of another method for forming a metal barrier.

It should be understood that features of certain drawings of this disclosure may not necessarily be drawn to scale, and that the figures illustrate non-limiting examples of the processes disclosed herein. Like symbols in the figures represent like elements.

DETAILED DESCRIPTION

FIG. 3A shows a lateral cross-sectional view of a dielectric layer 314 formed on a substrate 312. The substrate 312 may include, for example, a silicon wafer that contains microelectronic devices, a ceramic chip carrier, an organic chip carrier, a glass substrate, a GaAs, SiC or other semiconductor wafer, a circuit board, a plastic film, and the like.

The dielectric layer 314 can include any dielectric or insulating material with a dielectric constant of about 1.8 to about 4.0. In some non-limiting embodiments, the dielectric layer 314 includes an ultra low-k dielectric material. In an embodiment, the dielectric layer 314 includes spin-on ultra low-k dielectrics, for instance, organosilicates. In some embodiments, the dielectric material may be porous, including microporous and mesoporous dielectrics, for instance, having dielectric constants ranging from about 1.8 to about 2.4.

In various embodiments, the dielectric layer 314 includes mobile metal ions. In some embodiments, the mobile metal ions have an effective ionic radius of from about 60 to about 170 pm (picometers). In various embodiments, the mobile metal ions may include cesium (Cs), cobalt (Co), rubidium (Rb), tantalum (Ta), manganese (Mn), ruthenium (Ru), gold (Au), titanium (Ti), hafnium (H) and combinations thereof. In some embodiments, the mobile metal ions are selected from Cs, Co, Mn and combinations thereof.

In some embodiments, the mobile metal ions may react with the dielectric material to form an immobile compound or complex. For example, ions such as, for example, Cs and Mn, may react with a dielectric to form an immobile metal-silicate compound. In some embodiments, the mobile metal ions include any metal ions capable of forming oxides, preferably, metals belonging to the group 2 elements and the second and third row transition metal elements, such as groups 3-8 of the periodic table.

In various embodiments, the mobile metal ions are present in the dielectric layer 314 at about 1 ppm to about 1000 ppm, or from about 1 to about 500 ppm, or from about 10 to about 500 ppm, or from about 10 to about 100 ppm.

In one embodiment, the dielectric layer 314 can be formed on the substrate 312 by applying a liquid dielectric composition including mobile metal ions onto the substrate 312. For example, the liquid dielectric composition is applied by spin-coating the liquid dielectric composition onto the substrate 312 or by depositing the liquid dielectric composition onto the substrate 312 across a mask.

After application, the applied liquid dielectric composition is at least partially cured or hardened. In various embodiments, the at least partially curing or hardening includes heating the liquid dielectric composition at about 300 to about 450° C. for between about 5 minutes and about 10 hours.

In another embodiment not shown in FIG. 3A, after the dielectric layer 314 is at least partially cured, another dielectric layer that is substantially free of metal ions can be applied on the dielectric layer 314.

After the curing step described above, the dielectric layer 314 may optionally be patterned using, for example, photolithography, plasma, dry etching, wet etching, ashing, and combinations thereof, as shown in FIG. 3B. These processing steps can damage the exposed surfaces 316 of the dielectric layer 314, and such damage can be oxidative in nature, which in some embodiments can form electron-rich regions near the surfaces 316. In various examples, which are not intended to be limiting, the electron-rich regions near the surface 316 can include, but are not limited to, native oxide layers, plasma damaged surfaces such as those formed in dielectric materials following etch or ashing processes, oxygen-rich regions, and combinations thereof.

The metal ions then diffuse or migrate to the surface 316 of the dielectric layer 314 and accumulate at or near the surface 316 to form a barrier layer 318 (FIG. 3C). Without being bound by theory, presently available evidence indicates that the metal ions in the dielectric layer 314 diffuse or migrate to electron rich regions, such as oxygen-rich or nitrogen-rich regions, at or near the surface 316, which depletes the remainder of the dielectric layer 314a in metal ions. The depleted dielectric layer 314a includes a lower concentration of the metal ions than the metal barrier layer 318, or is substantially free of metal ions in its bulk.

In various embodiments, the metal barrier layer 318 includes complex metal-silicates, for instance, compounds represented by the general empirical formula $M_pSi_rO_sC_xH_y$. In various embodiments, the subscripts p, r and s in the empirical formula are positive numbers. In some embodiments, any or all of p, r and s may be integers. In other embodiments, any or all of p, r and s may be fractions or any other non-integer positive numbers. In various embodiments, any of the subscripts x and y may be zero, or non-zero positive numbers. In some embodiments, one or both of x and y may be integers. In other embodiments, one or both of x and y may be fractions or any other non-integer positive numbers.

In one embodiment, the dielectric layer 314, the substrate 312, or both, can be heated to drive the metal ions to the surface 316. The heating can include a predetermined annealing step, or may include a predetermined pattern of heating. In various embodiments, the dielectric layer 314 is heated to about 100° C. to about 450° C., or about 125° C. to about 450° C., or about 300° C. to about 400° C. In some embodiments, the dielectric layer 314 is heated for at least about 5 minutes, or for at least about 10 minutes, or for at least about 15 minutes, or for at least about 25 minutes, or for at least about 40 minutes, or from about 5 minutes to about 50 minutes, or from about 1 hour to about 10 hours, or from about 5 minutes to 10 hours. In one particular embodiment, the dielectric layer 314 is heated at about 400° C. for at least about 40 minutes.

A metal interconnect 320 is deposited over the metal barrier layer 318 (FIG. 3D). Suitable metal interconnects 320 include, but are not limited to, copper, aluminum, silver, gold, and combinations thereof. In various embodiments, the metal barrier layer 318 resists or substantially prevents migration, diffusion or any other form of undesirable transfer of metal, including metal ions, from the metal interconnect 320 to the depleted dielectric layer 314a. After the metal interconnect 320 is deposited, the barrier layer 318 remains at the surface 316 of the dielectric layer 314a and forms an interface between the dielectric layer 314a and the metal interconnect 320.

The process described in FIGS. 3A-3D can be used in, for example, a dual damascene process to fabricate a structure that can be employed in a microelectronic device, such as high speed microprocessors, application specific integrated circuits (ASICs), or memory devices, as non-limiting examples. In some examples, the combination of the at least one conductive feature and the at least one dielectric layer may be repeated to form a multilevel interconnect stack.

FIG. 4A illustrates an alternative embodiment in which a dielectric layer 414 is formed substantially metal ion-free on a substrate 412 using a process such as, for example, plasma enhanced chemical vapor deposition (PECVD), and later impregnated with the metal ions, yielding a metal ion containing dielectric film 414a (FIG. 4B). Typical metal ion impregnation occurs after dielectric deposition, by spin-coating an appropriate metal-ion solution (suitable solvents for the metal ion solution are similar to those listed below for the rinsing steps) on the surface of the PECVD deposited film. In various embodiments, the structure is then heated to an intermediate temperature from about 85° C. to about 200° C. During or after the heating step, remaining metal ion film can optionally be rinsed off from the surface of the dielectric layer using a solvent. Suitable solvents include, but are not limited to, protic solvents, including water, alcohols or alcohol esters, or aprotic solvents, including dimethyl formamide, dimethyl sulfoxide, or N-methyl pyrrolidinone.

As shown in FIG. 4C, the dielectric layer 414a can then be patterned using, for example, photolithography, plasma, dry etching, wet etching, ashing, and combinations thereof. As noted above, these processing steps can damage the exposed surfaces 416 of the dielectric layer 414a, and such damage can be oxidative in nature, which forms electron-rich regions near the surface 416.

In various embodiments, the dielectric layer 414a, the substrate 412, or both, may optionally be heated to about 100° C. to about 450° C. after the metal ion deposition and patterning, to transfer at least some metal ions to the electron-rich surface 416 and form a barrier layer 418 (FIG. 4D) thereon, which depletes the remainder of the dielectric layer 314a in metal ions. The depleted dielectric layer 414b includes a lower concentration of the metal ions than the metal barrier layer 318, or is substantially free of metal ions in its bulk.

During or after the metal barrier layer 418 is formed, a metal interconnect 420 is deposited onto the barrier layer 418, as shown in FIG. 4E. In various embodiments, the dielectric layer barrier layer 418 may promote adhesion of subsequent layers, such as the metal layer 420, to the region of the dielectric pattern 414a. In an embodiment, the metal interconnect 320 includes copper, aluminum, or other metals. The metal barrier layer 418 resists or substantially prevents migration, diffusion or any other form of undesirable transfer of metal, including metal ions, from the metal interconnect 420 to the dielectric layer 414b.

Figure 5:
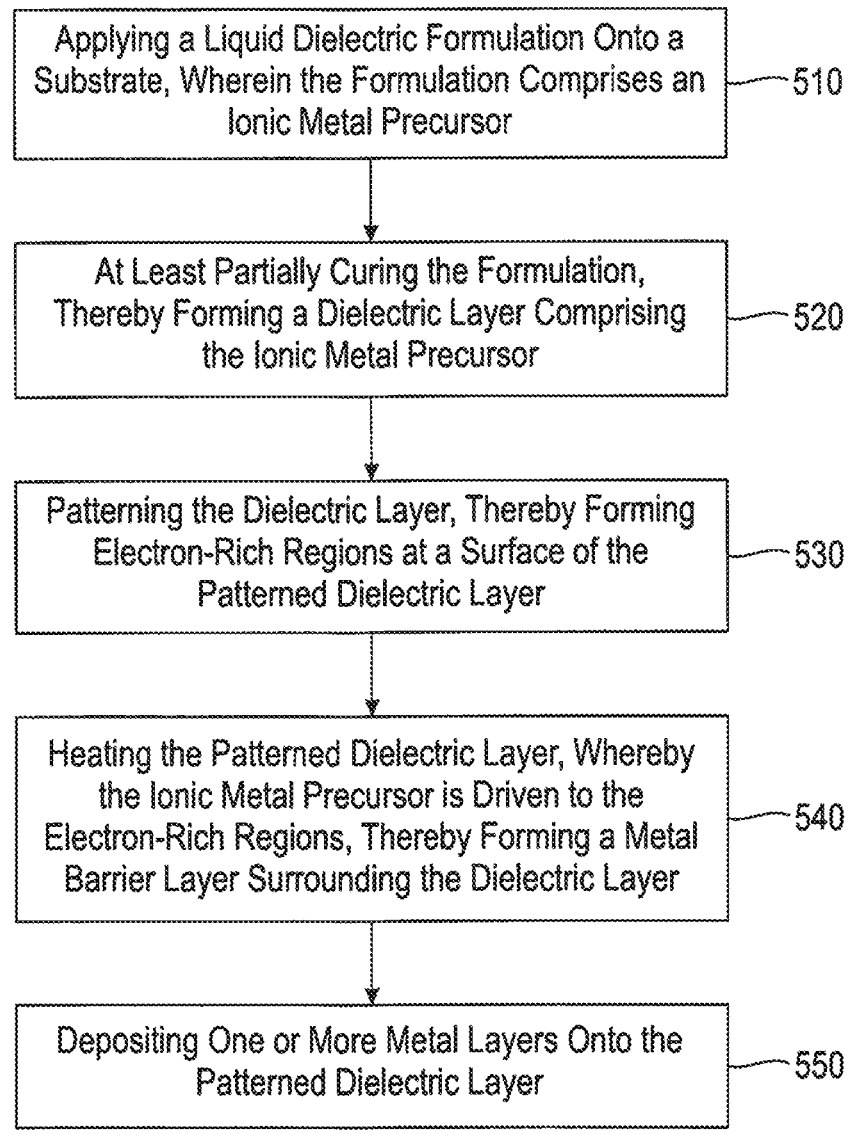
FIG. 5 is a flow diagram illustrating an embodiment of a process according to the present disclosure.

FIG. 5 is a flow chart illustrating an embodiment of a process that includes applying (510) a liquid dielectric composition onto a substrate, where the composition includes metal ions. The applying step 510 is followed by a curing step 520, including at least partially curing the composition to form a dielectric layer including the metal ions. The curing step 520 is followed by a patterning step 530, which includes patterning the dielectric layer to form electron-rich regions at a surface of the patterned dielectric layer. The curing step 520 or the patterning step 530 or both are followed by a heating step 540, including heating the patterned dielectric layer to drive the diffusion of the metal ions to the electron-rich regions and form a metal barrier layer on the dielectric layer. In a depositing step 550, one or more metal interconnect layers are deposited onto the barrier layer.

FIG. 6A shows a lateral cross-sectional view of embodiments of a semiconductor device structure including a metal pattern 621 disposed on a substrate 632. In an embodiment, the metal pattern 621 includes a metal interconnect 630 formed from, for example, copper, aluminum, gold, silver, or alloys or combinations thereof. The metal interconnect 630 may be deposited in a predetermined pattern on the substrate 632. In another embodiment, metal interconnect 630 may first be deposited on the substrate 632, followed by patterning the deposited metal interconnect 630. In various non-limiting embodiments, the metal interconnect 630 may be formed by metallization, photolithography, plasma processes, etching, sputtering, physical vapor deposition, chemical-mechanical planarization, or other suitable processes. In an embodiment, the metal interconnect 630 may be formed by a dual subtractive metal etch process, for instance, including a suitable etch scheme.

A surface layer 622 of the metal interconnect 630 in the metal pattern 621 includes electron-rich regions such as, for example, oxygen-rich regions. In one embodiment, the metal in metal interconnect 630 is susceptible to surface oxidation and the surface layer 622 is rich in a metal oxide. In an embodiment, the metal interconnect 630 includes copper, and the surface 622 is rich in a copper oxide.

In the embodiment illustrated in FIG. 6B, a dielectric layer 624, which includes metal ions, is applied on at least a portion of the metal pattern 621. The dielectric layer 624 may be deposited on exposed surfaces of the substrate 632 or other features, if present, on the substrate 632.

In one embodiment, the dielectric layer 624 can be formed by applying a liquid dielectric composition containing metal ions onto the metal pattern 621, and at least partially curing or hardening the composition. During or after the liquid dielectric composition is applied to form the dielectric layer 624, the metals ions in the dielectric layer 624 diffuse or migrate to the oxygen-rich surface 622 of the interconnect 630 and form a barrier layer 628 thereon (FIG. 6C), and leave behind a metal-ion depleted dielectric layer 624a. The barrier layer 628 forms an interface between the metal interconnect 630 and the first depleted dielectric layer 624a. As discussed above, in various embodiments, the metal barrier layer 628 includes complex metal-silicates such as, for example, the compounds represented by the general formula $M_pSi_rO_sC_xH_y$.

In some embodiments, the dielectric layer 624 of FIG. 6B is optionally directly or indirectly heated to drive the metal ions to the surface 622.

In another embodiment shown schematically in FIGS. 7A and 7B, a layer 724 of a liquid dielectric composition including metal ions may be applied as a thin layer on a surface 722 of a metal interconnect 730. In various embodiments, the surface 722 is an electron-rich surface. In various embodiments, the surface 722 includes metal oxides formed by ambient or intentional oxidation of the surface 22.

After heating, as shown in FIG. 7C, a metal barrier layer 728 including complex metal-silicates such as, for example, $M_pSi_rO_sC_xH_y$, is formed as the metal ions migrate from the layer 724 toward the oxygen-rich surface 722, leaving behind a thin first depleted dielectric layer 724a.

As shown in FIG. 7D, a second liquid dielectric layer 724b, which is free of metal ions and planarizing in nature, may be disposed on the first depleted dielectric layer 724a and subsequently cured, for instance, as shown in FIG. 7D. In various embodiments, the second dielectric layer 724b is substantially or completely free of metal ions. In various embodiments, the first depleted dielectric layer 724a forms a primer layer or a supporting layer for the second dielectric layer 724b. In various embodiment, the first depleted layer 724a helps the second dielectric layer 724b adhere well to the metal interconnect 730 or other layers.

The metal barrier layer 728 resists migration, diffusion or any other form of undesirable transfer of metal from the metal interconnect 730 to the first depleted dielectric layer 724a or the second dielectric layer 724b.

In another embodiment shown schematically in FIGS. 8A-8D, the surface 722 of the metal interconnect 730 is initially free of surface oxide or otherwise not electron-rich. In some embodiments, the surface 722 is free of oxides as a consequence of deposition of or an optional cleaning step. In some embodiments, a thin, conformal electron rich layer 824 including $SiO_2$ or other electron-rich material is deposited. This is followed by deposition of the planarizing dielectric composition, which includes metal ions as described in relation to various embodiments above. The structure is heated, to form a barrier layer 828 and a dielectric layer 826a that is devoid of metal ions. In some embodiments, the deposition of the electron-rich layer 824 is followed by the deposition of a primer layer 826 including dielectric material including metal ions, followed by heating this intermediate structure to temperatures commensurate with the formation of the barrier layer 828 as described above, followed by deposition of a planarizing dielectric composition 826b that is free or devoid of metal ions.

Figure 9:
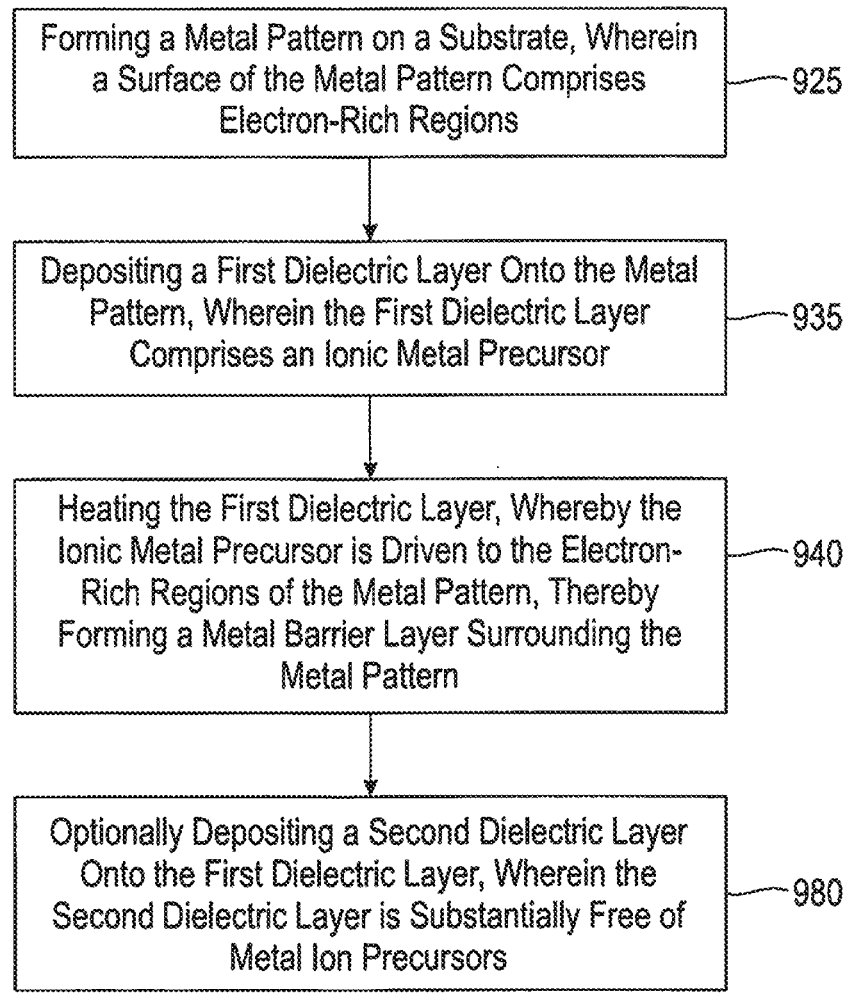
FIG. 9 is a flow diagram illustrating an embodiment of a technique.

FIG. 9 is a flow chart illustrating an embodiment of a process including forming (925) a metal pattern with a surface including electron-rich regions. After the forming step 925, a depositing step 935 includes depositing a first dielectric layer onto the metal pattern, where the first dielectric layer includes a metal ion.

After the depositing step 935, a heating step 940 includes heating the first dielectric layer, whereby the metal ions are driven to the electron-rich regions of the metal pattern to form a metal barrier layer thereon. After the heating step 940, an optional depositing step 880 includes depositing a second dielectric layer onto the first dielectric layer, where the second dielectric layer is substantially free of metal ions.

The processes of the present disclosure will now be illustrated by the following examples, which are not intended to be limiting.

EXAMPLES

Example 1

Figure 10:
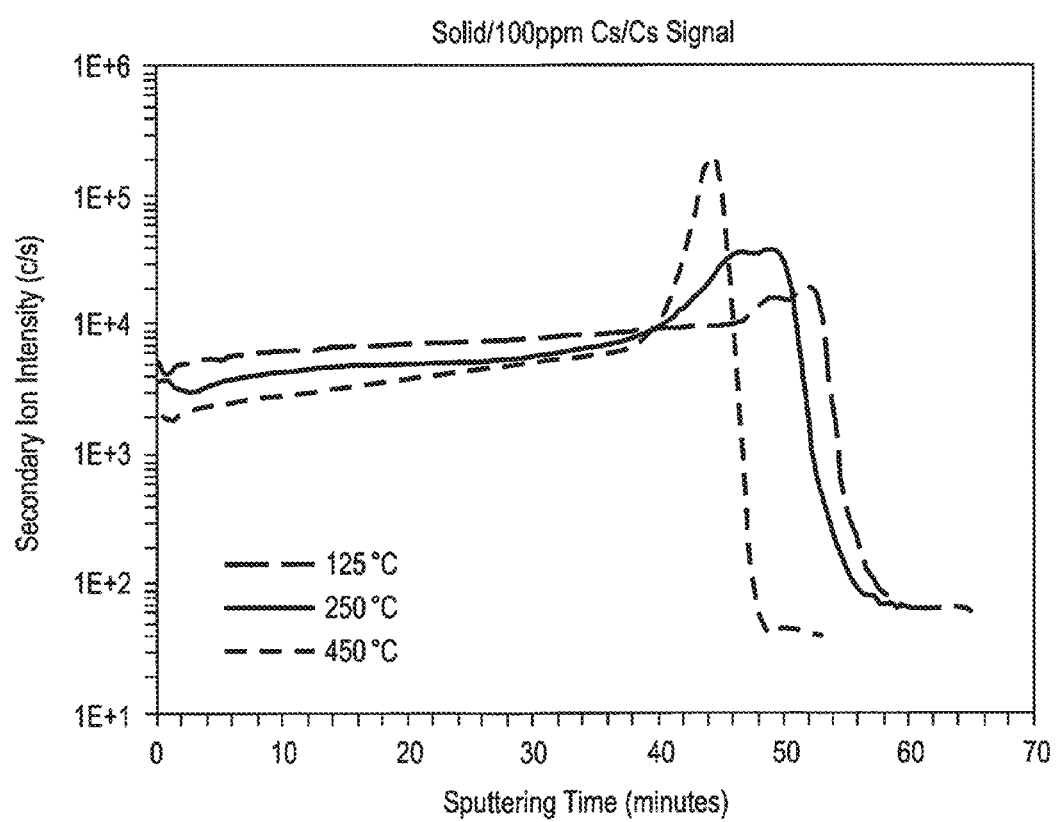
FIG. 10 is a plot showing the results of dynamic secondary ion mass spectroscopy (dynamic SIMS) analyses of $Cs^+$ doped organosilicate films at k=2.4.

100 ppm of cesium acetate salt was added to the liquid dielectric composition, followed by film deposition by spin-coating and concomitant thermal cure to form organosilicate films doped with $Cs^+$. The resulting film was subjected to sputtering via dynamic secondary ion mass spectroscopy (dynamic SIMS) analyses. FIG. 10 illustrates the results of sputtering organosilicate films (k=2.4) at three different temperatures. An oxygen beam at 3 keV with a raster size of 500 microns and 60 nA was used.

An accumulation of $Cs^+$ at the Si interface was reflected by the increase in the Cs secondary ion intensity at sputtering times commensurate with having completely drilled through the organosilicate films. It should be noted that the Si interface actually includes approximately 3-5 nm of $SiO_x$ (native oxide) on top of the Si surface. This native oxide layer constitutes the electron-rich region. The corresponding sputtering times decreased with increasing temperatures since the organosilicate films shrink with increasing cure temperatures, giving rise to progressively thinner films.

Example 2

Figure 11:
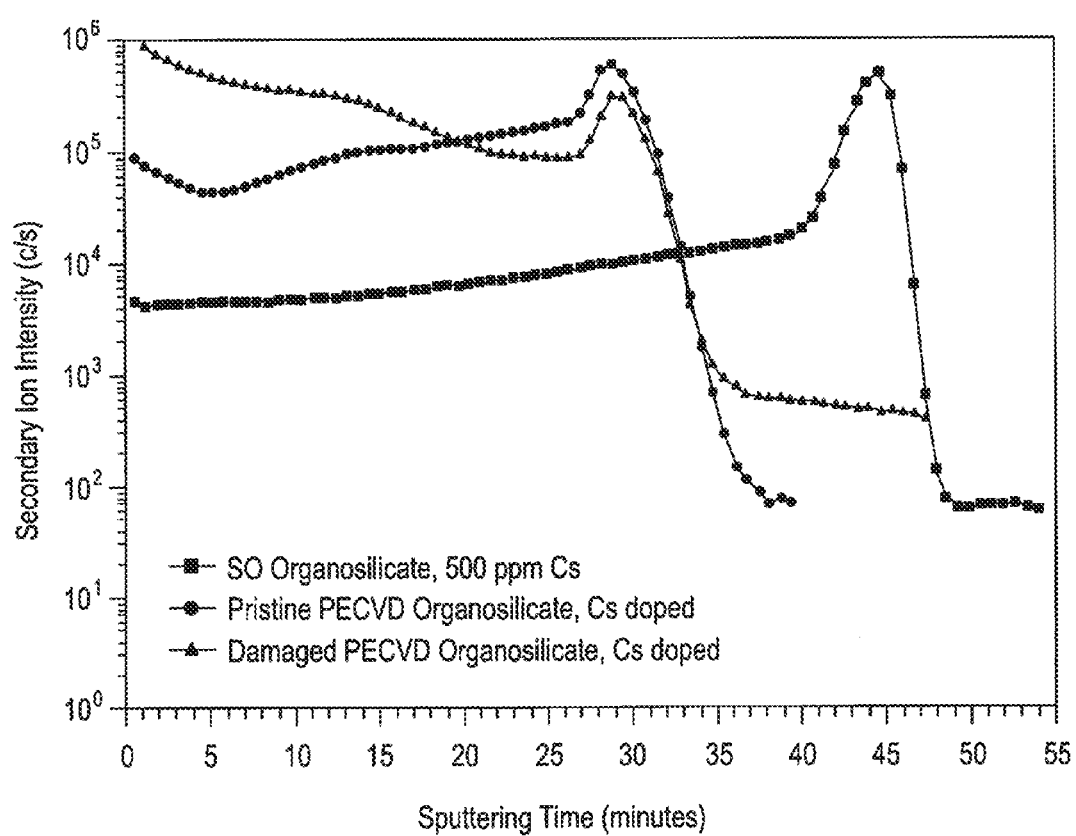
FIG. 11 is a plot showing dynamic SIMS elemental profiles for Cs, comparing PECVD based dielectric films with a spin-on (SO) dielectric film.

In this example, fully cured films were formed by dielectric film deposition by plasma enhanced chemical vapor deposition (PECVD). This was followed by applying Cs salt to the fully cured films. The Cs salt was introduced in the form of a solution applied by spin-coating, followed by post-apply baking the film to facilitate salt incorporation into the matrix. Finally, remaining surface salt was removed by rinsing with a suitable solvent. Typically, protic polar solvents such as water, alcohols, alcohol esters, as well as aprotic solvents (e.g., dimethyl formamide, dimethyl sulfoxide, and N-methyl pyrrolidinone) represent suitable rinse solvents. FIG. 11 shows dynamic SIMS elemental profiles for Cs, comparing PECVD based dielectric films with a spin-on (SO) dielectric film.

As shown in FIG. 11, Cs metal ion diffusion was evident when Cs salt was added to fully cured films. Comparing a Cs doped, undamaged PECVD film with a similar spin-coat derived film clearly shows the accumulation of Cs at the bottom interface. However, when performing the same Cs doping experiment on a plasma-damaged film (additional oxygen-rich, i.e., electron-rich, region at the top) one observes high concentrations of Cs at both the top and bottom interface.

Example 3

Figure 12:
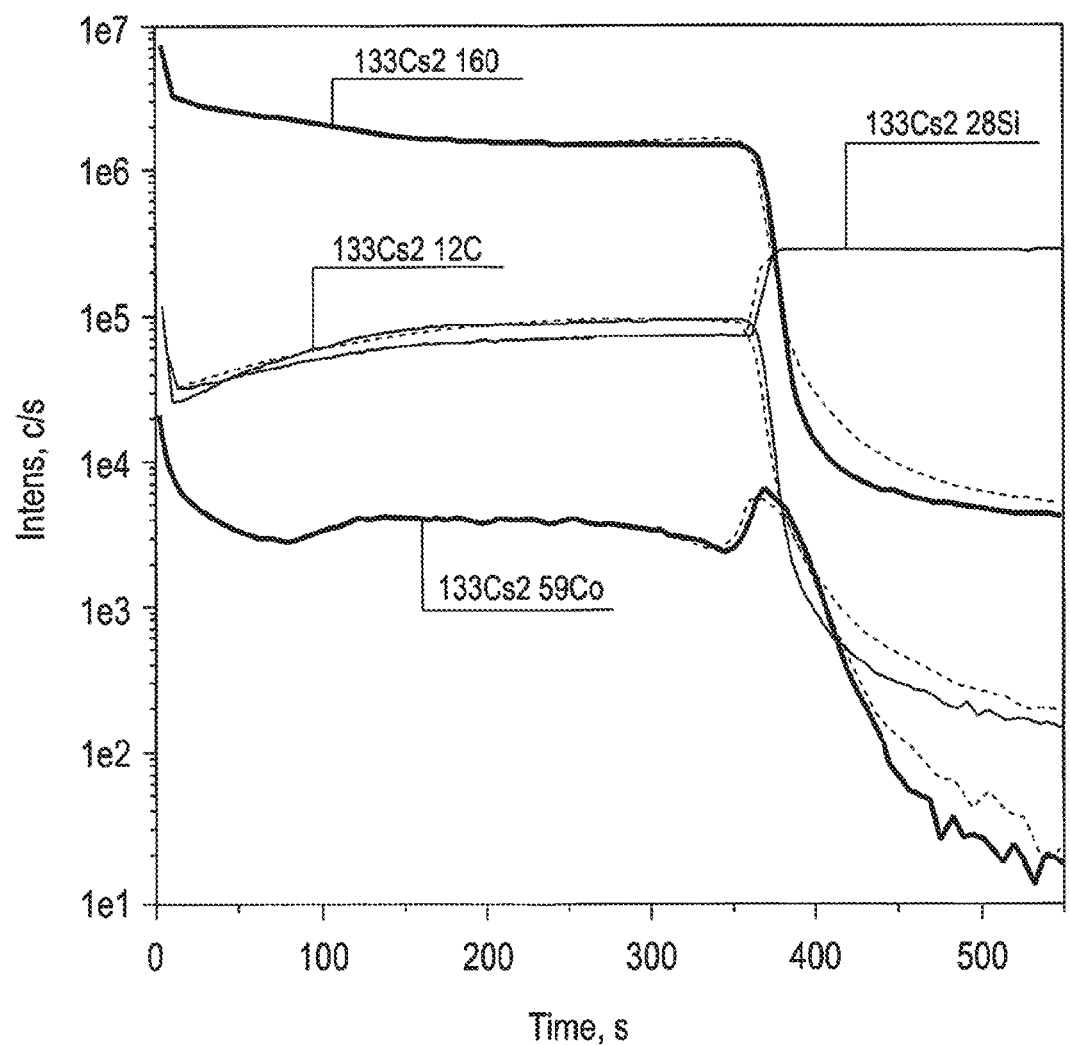
FIG. 12 is a plot of the dynamic SIMS results of $Co^{+2}$ doped organosilicate films at k=2.4.

This example is similar to Example 1, with cobalt (Co) doped organosilicate film. FIG. 12 shows the dynamic SIMS results of $Co^{+2}$ doped organosilicate films at k=2.4. The concentration of Co was 550 ppm. A cesium beam at 1.25 keV was used, with raster size of 175 microns at 20 nA. The curves in FIG. 12 represent the elemental composition of carbon (black line), silicon (green line), oxygen (red line) and cobalt (blue line) throughout the dielectric film. Sputtering occurs from the film surface (at left) down to the Si substrate on the far right. Similar to the accumulation of Cs in Example 1, accumulation of the Co was observed at the $Si/SiO_2$ interface.

The above examples demonstrate that metal barriers can be formed by introducing metal ions in dielectric compositions or layers, followed by heating to drive diffusion of the metal ions to electron-rich regions at the surfaces of dielectrics.

Various examples of the invention have been described. These and other examples are within the scope of the following claims.

The invention claimed is:

1. A method, comprising:
   applying a liquid dielectric composition onto a substrate, wherein the composition comprises metal ions;
   at least partially curing the composition to form a dielectric layer with the metal ions;
   patterning the dielectric layer to form electron-rich regions at a surface thereof;
   heating the patterned dielectric layer to drive the metal ions to the electron-rich regions thereof, thereby forming a metal barrier layer on at least a portion of the surface of the dielectric layer; and
   depositing one or more metal layers onto the metal barrier layer.

2. The method of claim 1, further comprising:
   after at least partially curing the composition, depositing another dielectric layer onto the at least partially cured dielectric layer, wherein said another dielectric layer is substantially free of metal ions.

3. The method of claim 1, wherein the metal ions are selected from the group consisting of Cs, Co, Mn, and combinations thereof.

4. The method of claim 1, wherein the metal ions are present in the liquid dielectric composition at about 1 ppm to about 1000 ppm.

5. The method of claim 1, wherein the patterned dielectric layer is heated to a temperature between about 100° C. to about 450° C. for a time between about 5 minutes and about 50 minutes.

6. The method of claim 1, wherein the patterned dielectric layer comprises a porous dielectric material.

7. A method, comprising:
impregnating at least a surface region of a cured dielectric layer with metal ions;
patterning the dielectric layer, thereby forming electron-rich regions at a surface of the patterned dielectric layer;
heating the patterned dielectric layer to drive the metal ions to the electron-rich regions and form a metal barrier layer at the surface of the patterned dielectric layer; and
depositing one or more metal layers onto the patterned dielectric layer.

8. The method of claim 7, wherein the impregnating at least a surface region of a cured dielectric layer comprises:
applying a film of a metal ion to the surface region,
heating the film, whereby the metal ions are incorporated into the dielectric layer, and
rinsing the surface of the dielectric layer with a solvent.

9. The method of claim 8, wherein the solvent comprises at least one of water, an alcohol, and an alcohol ester.

10. The method of claim 8, wherein the solvent comprises at least one of dimethyl formamide, dimethyl sulfoxide, and N-methyl pyrrolidinone.

11. The method of claim 7, wherein the metal ion is selected from the group consisting of Cs, Co, Mn and combinations thereof.

12. The method of claim 7, wherein the patterned dielectric layer comprises a porous dielectric material.

13. The method of claim 7, wherein the heating the patterned dielectric layer comprises heating the patterned dielectric layer to a temperature within a range of about 100° C. to about 450° C. for a time between about 5 minutes and about 50 minutes.

14. A method, comprising:
forming a metal pattern on a substrate, wherein a surface of the metal pattern comprises electron-rich regions;
depositing a first dielectric layer onto the metal pattern, wherein the first dielectric layer comprises metal ions; and
heating the first dielectric layer to cause the metal ions to diffuse to the electron-rich regions of the metal pattern, thereby forming a metal barrier layer on the metal pattern.

15. The method of claim 14, wherein the forming comprises:
depositing a metal; and
patterning the deposited metal.

16. The method of claim 14, wherein the depositing the first dielectric layer comprises:
applying a liquid dielectric composition comprising the metal ions onto the metal pattern; and
at least partially curing the composition.

17. The method of claim 14, wherein the metal ions are present in the first dielectric layer at about 1 ppm to 1000 ppm.

18. The method of claim 14, wherein the heating the first dielectric layer comprises heating the first dielectric layer to a temperature within a range of about 100° C. to about 450° C. for a time between about 5 minutes and about 50 minutes.

19. The method of claim 14, further comprising:
after heating the first dielectric layer, depositing a second dielectric layer onto the first dielectric layer, wherein the second dielectric layer is substantially free of metal ions.

* * * * *